US012695070B2

(12) United States Patent
Li et al.

(10) Patent No.: US 12,695,070 B2
(45) Date of Patent: Jul. 28, 2026

(54) MULTI-ZONE HEATER WITH MINIMUM RF LOSS

(71) Applicant: Applied Materials, Inc., Santa Clara, CA (US)

(72) Inventors: Jian Li, Fremont, CA (US); Edward P. Hammond, Hillsborough, CA (US); Vidyadharan Srinivasamurthy, Bengaluru (IN); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 838 days.

(21) Appl. No.: 17/371,592

(22) Filed: Jul. 9, 2021

(65) Prior Publication Data

US 2023/0011261 A1     Jan. 12, 2023

(51) Int. Cl.
*H01J 37/32* (2006.01)
*H10P 72/72* (2026.01)
*H10P 76/00* (2026.01)

(52) U.S. Cl.
CPC ...... *H01J 37/32724* (2013.01); *H10P 72/722* (2026.01); *H10P 76/00* (2026.01)

(58) Field of Classification Search
CPC .......................... H01J 37/3272; H01L 21/6833
See application file for complete search history.

(56) References Cited

U.S. PATENT DOCUMENTS

2009/0274590 A1 * 11/2009 Willwerth ......... H01L 21/68792
                                                                422/186.04
2017/0271190 A1     9/2017 Kim et al.
2017/0332480 A1 * 11/2017 Ohkura .................. H05B 3/267

2018/0158709 A1     6/2018 Tsuji et al.
2018/0337081 A1 * 11/2018 Ye ............................ C25D 7/00
2019/0013222 A1     1/2019 Kim et al.
2019/0027344 A1     1/2019 Okunishi et al.
(Continued)

FOREIGN PATENT DOCUMENTS

JP      2011061040 A * 3/2011 ....... H01L 21/68785
JP      2012089694 A     5/2012
(Continued)

OTHER PUBLICATIONS

Application No. PCT/US2022/035292 , International Preliminary Report on Patentability, Mailed On Jan. 18, 2024, 8 pages.
(Continued)

*Primary Examiner* — Cachet I Proctor

(74) *Attorney, Agent, or Firm* — Kilpatrick Townsend & Stockton LLP

(57) ABSTRACT

Exemplary substrate support assemblies may include an electrostatic chuck body defining a substrate support surface that defines a substrate seat. The substrate support assemblies may include a support stem coupled with the electrostatic chuck body. The substrate support assemblies may include an upper heater embedded within the electrostatic chuck body. The upper heater may include a center heater zone and one or more annular heater zones that are concentric with the center heating zone. The substrate support assemblies may include a lower heater embedded within the electrostatic chuck body at a position below the upper heater. The lower heater may include a plurality of arcuate heater zones.

15 Claims, 9 Drawing Sheets

(56) References Cited

U.S. PATENT DOCUMENTS

| | | | | |
|---|---|---|---|---|
| 2019/0148205 A1* | 5/2019 | Kim | .................... | H01J 37/3244 |
| | | | | 156/345.33 |
| 2019/0153600 A1* | 5/2019 | Roberts | ............ | C23C 16/45544 |
| 2019/0304820 A1* | 10/2019 | Baggett | ............. | H01L 21/67248 |
| 2019/0371577 A1* | 12/2019 | Benjaminson | .... | H01L 21/67103 |
| 2020/0185247 A1* | 6/2020 | Chia | ................... | H01L 21/6833 |
| 2021/0057187 A1 | 2/2021 | Kim et al. | | |

FOREIGN PATENT DOCUMENTS

| | | | | | |
|---|---|---|---|---|---|
| JP | 2016072477 | A | 5/2016 | | |
| JP | 2017157617 | A | 9/2017 | | |
| JP | 2018206805 | A | 12/2018 | | |
| KR | 20180011119 | A | 1/2018 | | |
| KR | 20200076758 | A | 6/2020 | | |
| KR | 20210028137 | A | 3/2021 | | |
| TW | 200515841 | A | 5/2005 | | |
| TW | 200842973 | A | 11/2008 | | |
| TW | 200926348 | A | 6/2009 | | |
| TW | 201119524 | A | 6/2011 | | |
| WO | WO-2016080502 | A1 * | 5/2016 | ....... | H01L 21/67103 |
| WO | 2017205178 | A1 | 11/2017 | | |

OTHER PUBLICATIONS

International Search Report and Written Opinion mailed on Oct. 25, 2022 in International Patent Application No. PCT/US2022/035292, 11 pages.

Search Report for Taiwan Patent Application No. 111125723 mailed Feb. 8, 2023, 9 pages.

Search Report for Taiwan Patent Application No. 111125723 mailed May 17, 2023, 10 pages.

Office Action for Taiwan Patent Application No. 111125723 mailed Oct. 12, 2023, 12 pages.

Office Action for Taiwan Patent Application No. 111125723 mailed Jun. 26, 2024, 10 pages.

Office Action for Korean Patent Application No. 1020247004239 mailed Nov. 29, 2024, 8 pages.

JP2024-500247, "Office Action", Jan. 28, 2025, 9 pages.

Japanese Application No. 2024-500247, Office Action mailed on Jul. 8, 2025, 4 pages (2 pages of English Translation and 2 pages of original document).

Korean Application No. 10-2024-7004239, Office Action mailed on Aug. 24, 2025, 11 pages (4 pages of English Translation and 7 pages of original document).

Taiwanese Application No. 111125723, Office Action mailed on Jan. 12, 2026, 13 pages (1 page of English Translation and 12 pages of original documents).

* cited by examiner

600

605

605

605

605

800

MULTI-ZONE HEATER WITH MINIMUM RF LOSS

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma, as well as to chuck the substrate to the support electrostatically. Plasma generated near the substrate may cause bombardment of components, as well as parasitic plasma formation in unfavorable regions of the chamber. The conditions may also lead to discharge between substrate support electrodes. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary substrate support assemblies may include an electrostatic chuck body defining a substrate support surface that defines a substrate seat. The substrate support assemblies may include a support stem coupled with the electrostatic chuck body. The substrate support assemblies may include an upper heater embedded within the electrostatic chuck body. The upper heater may include a center heater zone and one or more annular heater zones that are concentric with the center heating zone. The substrate support assemblies may include a lower heater embedded within the electrostatic chuck body at a position below the upper heater. The lower heater may include a plurality of arcuate heater zones.

In some embodiments, the substrate support assemblies may include a plurality of AC power rods extending through the support stem, each of the plurality of heater power rods being electrically coupled with a respective heater zone. Each of the plurality of heater power rods may be spaced apart by at least 2 mm within the support stem. The substrates support assemblies may include an RF rod extending through the support stem and electrically coupled with the electrostatic chuck body. The RF rod may be spaced apart from each of the plurality of heater rods by at least 3 mm within the support stem. The substrate support assemblies may include a first heater return rod that is coupled with the center heater zone and each of the one or more annular heater zones. The substrate support assemblies may include a second heater return rod that is coupled with each of the plurality of arcuate heater zones. The lower heater may be disposed at a distance of between about 2 mm and 10 mm from the upper heater. An inner edge of each of the plurality of arcuate heater zones may be disposed radially inward of the substrate seat. An outer edge of each of the plurality of arcuate heater zones may be disposed at a distance from a center of the substrate seat that is aligned with or radially outward of a peripheral edge of the substrate seat.

Some embodiments of the present technology may also encompass substrate support assemblies that include an electrostatic chuck body defining a substrate support surface that defines a substrate seat. The substrate support assemblies may include a support stem coupled with the electrostatic chuck body. The substrate support assemblies may include an upper heater embedded within the electrostatic chuck body. The substrate support assemblies may include a lower heater embedded within the electrostatic chuck body at a position below the upper heater. The lower heater may include a plurality of lower heater zones.

In some embodiments, each of the plurality of lower heater zones may include a heating coil. An inner edge of each of the plurality of lower heater zones may be positioned radially outward of at least about 50% of a radius of the substrate seat. Each of the plurality of lower heater zones may include an arcuate shape or a wedge shape. The plurality of lower heater zones may include at least four lower heater zones. The upper heater may include a plurality of upper heater zones. The plurality of upper heater zones may include a circular heater zone and at least two annular circular heater zones that are positioned radially outward of the circular heater zone. The substrate support assemblies may include an RF mesh embedded within the electrostatic chuck body above the upper heater. The plurality of lower heater zones may collectively form an annular shape defining an open central region.

Some embodiments of the present technology may also encompass methods of processing a substrate. The methods may include heating an upper heater embedded within a substrate support assembly. The methods may include heating at least one lower heater zone of a plurality of lower heater zones embedded within the substrate support assembly below the upper heater that include heating a top surface of a substrate support assembly. The methods may include flowing a precursor into a processing chamber. The methods may include generating a plasma of the precursor within a processing region of the processing chamber. The methods may include depositing a material on the substrate. In some embodiments, the upper heater may include a plurality of upper heater zones. Heating the upper heater may include heating at least one of the plurality of upper heater zones. The methods may include clamping a semiconductor substrate to a support surface of a substrate platform using a chucking voltage.

Such technology may provide numerous benefits over conventional systems and techniques. For example, embodiments of the present technology may provide substrate supports that may provide better edge heating capabilities to increase film deposition at the edge regions of the wafer. These and other embodiments, along with many of their advantages and features, are described in more detail in conjunction with the below description and attached figures.

3

BRIEF DESCRIPTION OF THE DRAWINGS

A further understanding of the nature and advantages of the disclosed technology may be realized by reference to the remaining portions of the specification and the drawings.

Figure 1A:
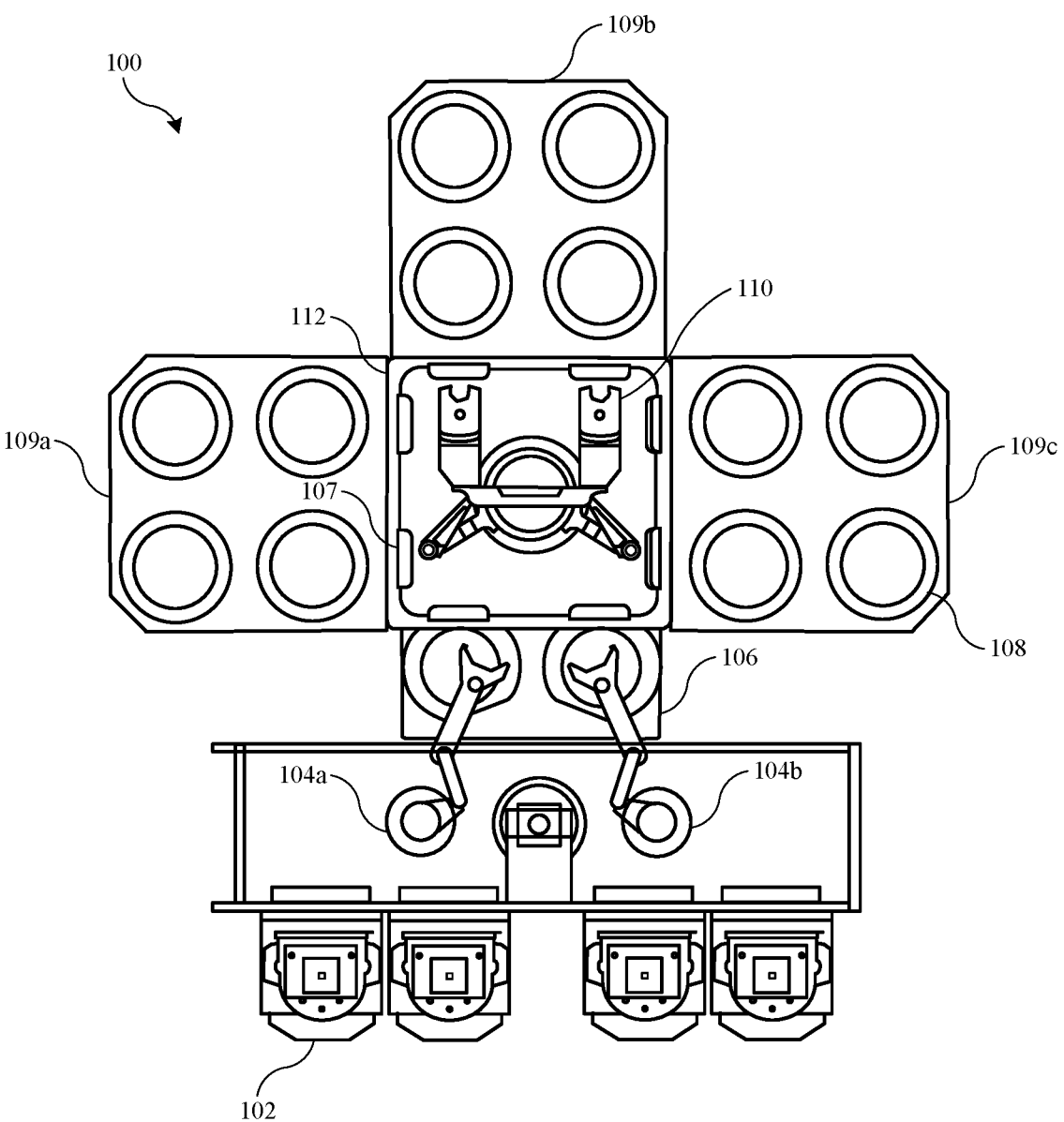
FIG. 1A shows a schematic top view of an exemplary processing tool according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce residual non-uniformity across a substrate. Temperature differences, flow pattern uniformity, and other aspects of processing may impact the films on the substrate, creating film uniformity differences across the substrate for materials produced or removed. For example, turbulent deposition gas flow and/or misalignment of apertures of a blocker plate and faceplate of a gas box may lead to non-uniform flow of deposition gases. In some instances, the blocker plate may not uniformly distribute flow of precursors to edge regions of a substrate. Additionally, in some embodiments a substrate support or heater on which a substrate is disposed may include one or more heating mechanisms to heat a substrate. When heat is delivered or lost differently between regions of a substrate, the film deposition may be impacted where, for example, warmer portions of the substrate may be characterized by thicker deposition or different film properties relative to cooler portions. This temperature non-uniformity may be attributable, for example, to temperature fluctuations about the shaft of the pedestal and may particularly affect edge regions of substrates.

The present technology may incorporate substrate support assemblies that include multiple heaters, which may each include multiple heater zones. For example, substrate support assemblies according to some embodiments of the present technology may include an upper heater having a number of heater zones designed to mitigate radial film thickness non-uniformity and a lower heater having a number of heater zones designed to mitigate azimuthal film thickness non-uniformity. Each heater zone may be independently controllable, enabling the temperature distribution across the substrate support assembly to be carefully controlled to minimize hot and cold spots to improve film uniformity across a wafer. Additionally, embodiments may space the heaters apart from one another, and from an RF mesh, sufficiently far to minimize RF coupling loss and/or DC leakage current.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
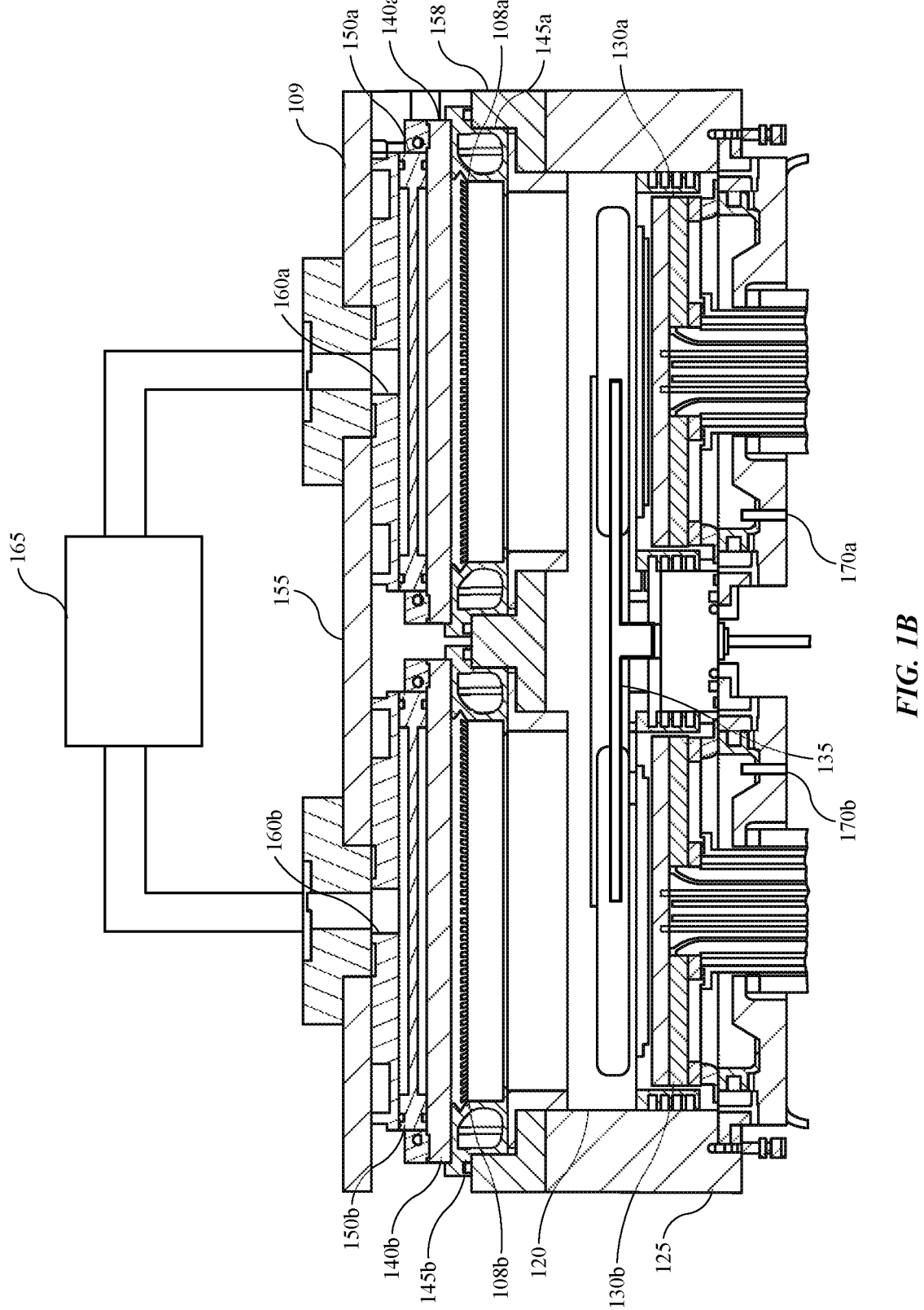
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130*a* may deliver a substrate into processing region 108*a*, while substrate support 130*b* may deliver a substrate into processing region 108*b*. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140*a* may be included to define from above processing region 108*a*, and faceplate 140*b* may be included to define from above processing region 108*b*. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145*a* may at least partially radially define processing region 108*a*, and pumping liner 145*b* may at least partially radially define processing region 108*b*. A blocker plate 150 may be positioned between a lid 155 and the faceplate 140 in embodiments, and again separate blocker plates may be included to facilitate fluid distribution within each processing region. For example, blocker plate 150*a* may be included for distribution towards processing region 108*a*, and blocker plate 150*b* may be included for distribution towards processing region 108*b*.

Lid 155 may be a separate component for each processing region, or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160*a* for fluid delivery to processing region 108*a*, and lid 155 may define a second aperture 160*b* for fluid delivery to processing region 108*b*. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170*a* may extend through the housing proximate substrate support 130*a*, and a second purge channel 170*b* may extend through the housing proximate substrate support 130*b*. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170*b* may be exhausted from the processing system from pumping liner 145*b*.

Figure 2:
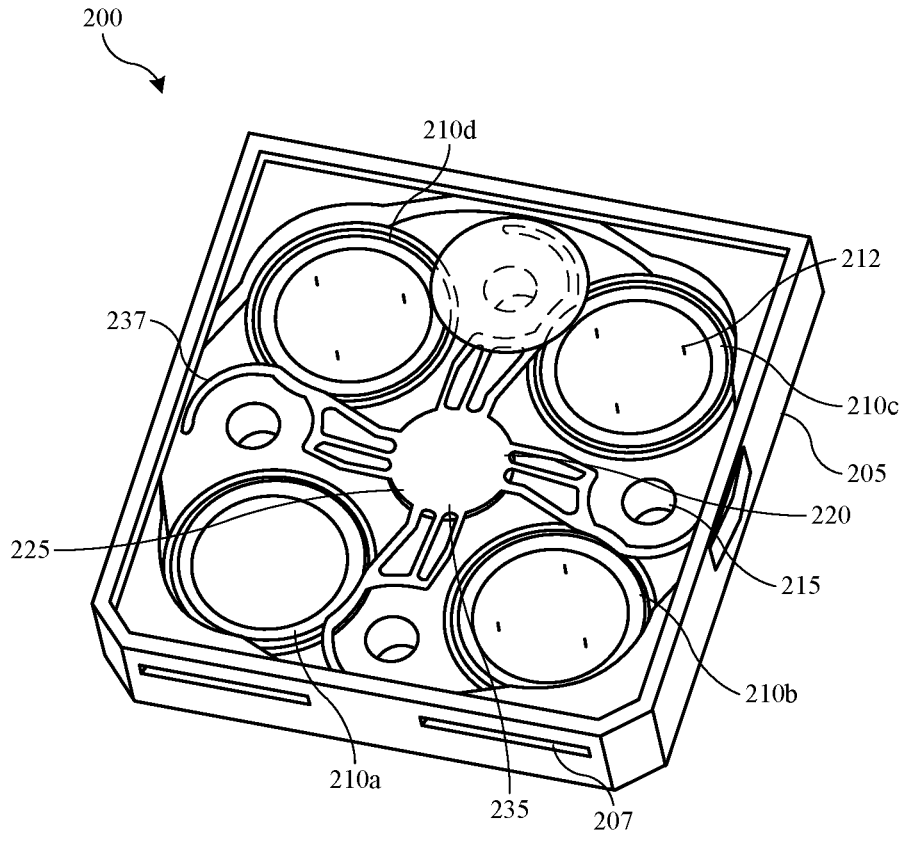
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210*a* or 210*b* through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210*a* and 210*b* to substrate supports 210*c* and 210*d*, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
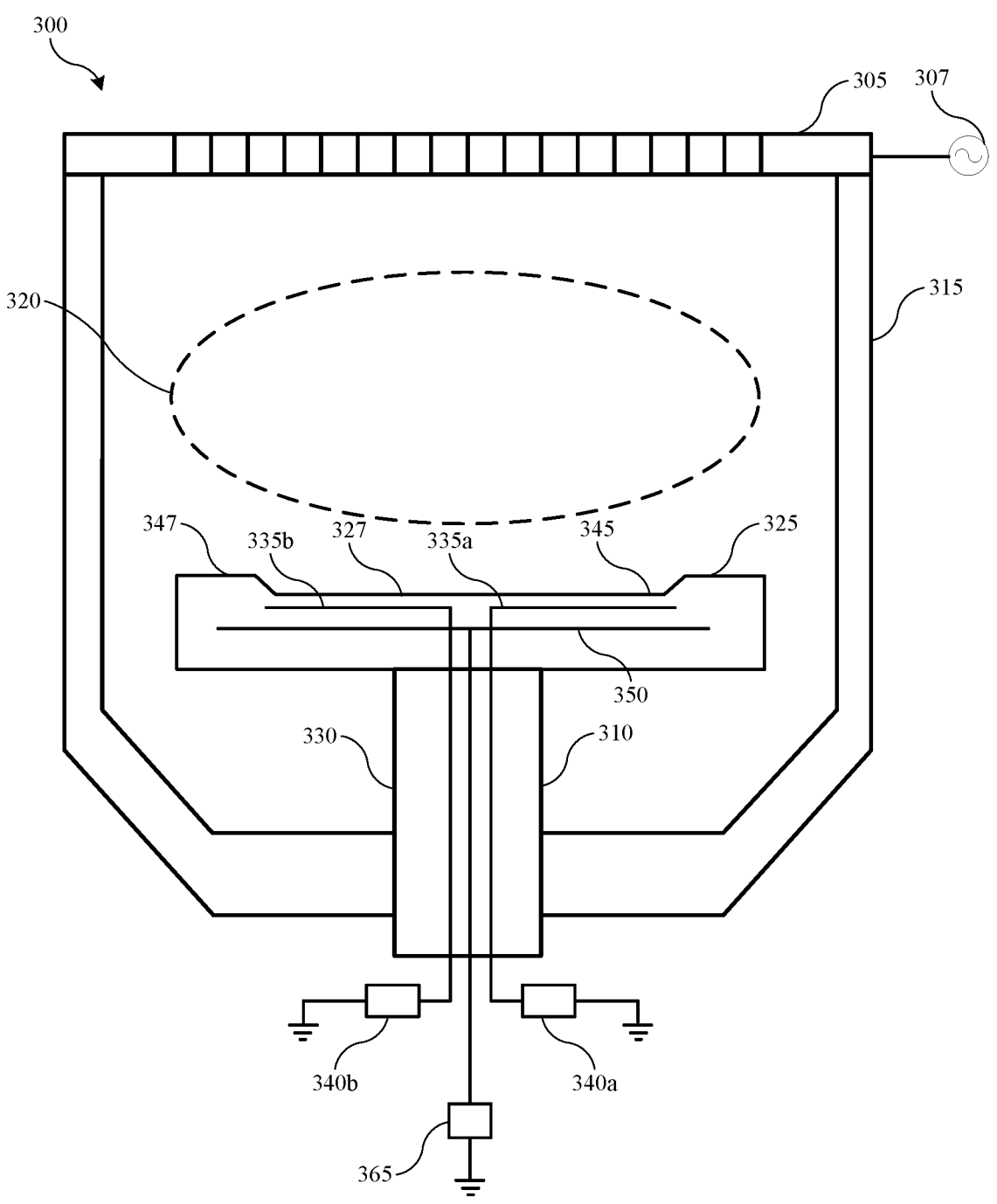
FIG. 3 shows a schematic partial cross-sectional view of an exemplary semiconductor processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. In some embodiments, the electrostatic chuck body 325 may be formed from a conductive material (such as a metal like aluminum or any other material that may be thermally and or electrically conductive) and may be coupled with a source of electric power (such as DC power, pulsed DC power, RF bias power, a pulsed RF source or bias power, or a combination of these or other power sources) through a filter, which may be an impedance matching circuit to enable the electrostatic chuck body 325 to operate as an electrode. In other embodiments, a top portion of the electrostatic chuck body 325 may be formed from a dielectric material. In such embodiments, the electrostatic chuck body 325 may include separate electrodes. For example, the electrostatic chuck body 325 may include a first bipolar electrode 335*a*, which may be embedded within the chuck body proximate the substrate support surface. Electrode 335*a* may be electrically coupled with a DC power source 340*a*. Power source 340*a* may be configured to provide energy or voltage to the electrically conductive chuck electrode 335*a*. This may be operated to form a plasma of a precursor within the processing region 320 of the semiconductor processing chamber 300, although other plasma operations may similarly be sustained. For example, electrode 335*a* may also be a chucking mesh that operates as electrical ground for a capacitive plasma system including an RF source 307 electrically coupled with showerhead 305. For example, electrode 335*a* may operate as a ground path for RF power from the RF source 307, while also operating as an electric bias to the substrate to provide electrostatic clamping of the substrate to the substrate support surface. Power source 340*a* may include a filter, a power supply, and a number of other electrical components configured to provide a chucking voltage.

The electrostatic chuck body may also include a second bipolar electrode 335*b*, which may also be embedded within the chuck body proximate the substrate support surface. Electrode 335*b* may be electrically coupled with a DC power source 340*b*. Power source 340*b* may be configured to provide energy or voltage to the electrically conductive chuck electrode 335*b*. Additionally electrical components and details about bipolar chucks according to some embodiments will be described further below, and any of the designs may be implemented with processing chamber 300. For example, additional plasma related power supplies or components may be incorporated.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340*a* and 340*b* may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. If present, the chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges.

In some embodiments, the chamber 300 may include a purge gas source, such as a purge gas source fluidly coupled with a bottom of the chamber body 315. The purge gas source may supply a purge gas to the chamber 300 to remove any film that has been deposited on various components of the chamber 300, such as the support assembly 310.

Figure 4:
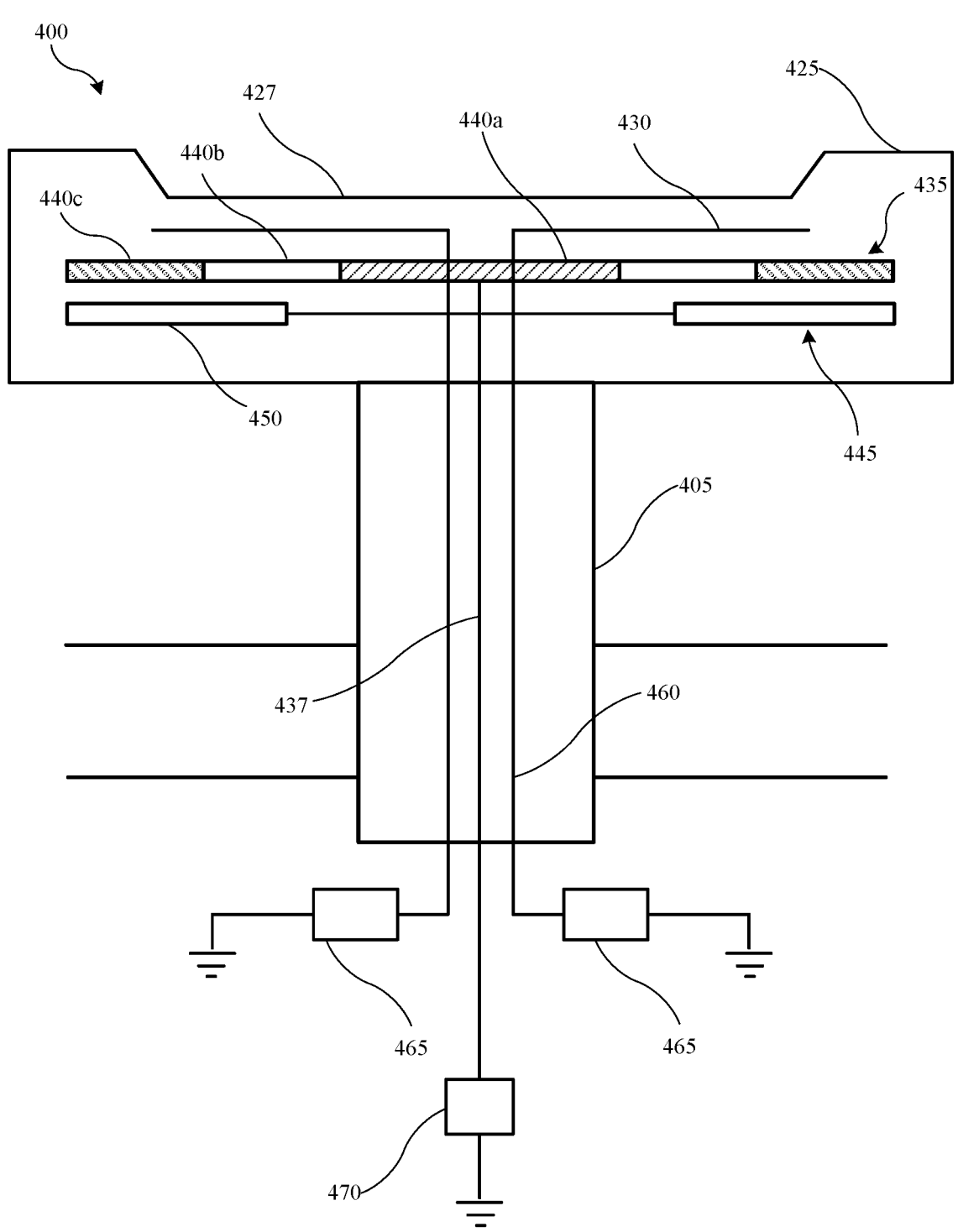
FIG. 4 shows a schematic partial cross-sectional view of an exemplary substrate support assembly according to some embodiments of the present technology.

FIG. 4 shows a schematic partial cross-sectional view of a substrate support assembly 400 according to some embodiments of the present technology. As explained above, the present technology may be used in some embodiments to perform film depositions and cures within a single chamber. Substrate support assembly 400 may be similar to substrate support assemblies 130, 210, and/or 310, and may include any feature, component, or characteristic of the support described above, including any associated components or power supplies. Substrate support assembly 400 may include a support stem 405, which may be a conductive material. An electrostatic chuck body 425, which may include one or more components embedded or disposed within the body, may be positioned atop the support stem 405. The components incorporated within the top puck may not be exposed to processing materials in some embodiments, and may be fully retained within the chuck body 425. Electrostatic chuck body 425 may define a substrate support surface 427.

The electrostatic chuck body 425 may include one or more RF electrodes 430 which may be embedded within the chuck body proximate the substrate support surface. For example, the electrodes 430 may include a chucking mesh that operates as electrical ground for a capacitive plasma system including an RF source electrically coupled with showerhead. An RF rod 460 may couple the RF electrodes 430 with a power source 465, such as an RF power source and/or a DC power source, that provide energy and/or voltage to the electrodes. For example, the electrodes 430 may operate as a ground path for RF power from the RF source, while also operating as an electric bias to the substrate to provide electrostatic clamping of the substrate to the substrate support surface 427.

In operation, a substrate may be in at least partial contact with the substrate support surface 427 of the electrostatic chuck body 425, which may produce a contact gap, and which may essentially produce a capacitive effect between a surface of the pedestal and the substrate. Voltage may be applied to the contact gap, which may generate an electrostatic force for chucking. An electric charge that migrates from the electrode to the substrate support surface 427 where it may accumulate, and which may produce a charge layer having Coulomb attraction with opposite charges at the substrate, and which may electrostatically hold the substrate against the substrate support surface 427 of the chuck body. This charge migration may occur by current flowing through a dielectric material of the chuck body based on a finite resistance within the dielectric for Johnsen-Rahbek type chucking, which may be used in some embodiments of the present technology.

The electrostatic chuck body 425 may include an upper heater 435, which may include one or more heating elements, such as conductive plates and/or heating coils. As just one example, conductive wire may be provided in a radially expanding spiral or other circuitous shape within the electrostatic chuck body 425 to provide relatively uniform heating across the substrate support surface 427. The upper heater 435 may be divided into a number of upper heater zones 440, with each upper heater zone 440 being formed of a respective conductive plate and/or heating coil. The upper heater 435 may be divided into any number of upper heater zones 440. For example, the upper heater 435 may include at least or about one upper heater zone, at least or about two upper heater zones, at least or about three upper heater zones, at least or about four upper heater zones, at least or about five upper heater zones, or more. As illustrated, the upper heater 435 is divided into three upper heater zones 440. For example, a center circular heater zone 440a is encircled by an inner annular upper heater zone 440b and an outer annular upper heater zone 440c, with each of the upper heater zones 440 being concentric with the substrate support.

The upper heater 435 may be positioned beneath the RF electrodes 430 by a distance that is sufficiently far to prevent RF coupling loss and DC leakage current, while still being sufficiently close to the substrate support surface 427 to effectively heat the substrate support surface 427. For example, the upper heater 435 may be positioned between or about 2 mm and 10 mm from the RF electrodes, between or about 3 mm and 9 mm from the RF electrodes 430, between or about 4 mm and 8 mm from the RF electrodes 430, or between or about 5 mm and 7 mm from the RF electrodes 430.

The electrostatic chuck body 425 may include a lower heater 445, which may include one or more heating elements, such as conductive plates and/or heating coils. The lower heater 445 may be divided into a number of lower heater zones 450, with each lower heater zone 450 being formed of a respective conductive plate and/or heating coil. The lower heater 445 may be divided into any number of lower heater zones 450. For example, the lower heater 445 may include at least or about one lower heater zone, at least or about two lower heater zones, at least or about three lower heater zones, at least or about four lower heater zones, at least or about five lower heater zones, at least or about six lower heater zones, at least or about seven lower heater zones, at least or about eight lower heater zones, at least or about nine lower heater zones, at least or about ten lower heater zones, or more. As illustrated, the lower heater 445 is divided into four lower heater zones 450. For example, each lower heater zone 440 may be arcuate in shape, and may extend along a portion of the radius of the substrate support surface 427.

The lower heater 445 may be positioned beneath the upper heater 435 by a distance that is sufficiently far to prevent leakage current, while still being sufficiently close to the substrate support surface 427 to effectively heat the substrate support surface 427. For example, the lower heater 445 may be positioned between or about 2 mm and 10 mm from the upper heater 435, between or about 3 mm and 9 mm from the upper heater 435, between or about 4 mm and 8 mm from the upper heater 435, or between or about 5 mm and 7 mm from the upper heater 435. While shown with the arcuate heating zones for heating the edge regions of the substrate support surface 427 being part of the lower heater 445, some embodiments may utilize such a heater zone arrangement as upper heater 435, with the full heater zone coverage as the lower heater 445.

Each heating element of the upper heater 435 and the lower heater 445 may be coupled with a power source 470, such as a power source that delivers AC and/or DC current to the respective heater, to heat the top puck. The current may be delivered to the heater through one or more rods or wires 437 that are disposed within channel formed within the stem 405 and the electrostatic chuck body 425. A temperature sensor may extend along the rods or wires 437 in some embodiments. Each heater may have a range of operating temperatures to heat the chuck body 425 and/or a substrate above or about 100° C., and the heater 435 may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. Each heater may also be configured to operate in any range encompassed between any two of these stated numbers, or smaller ranges encompassed within any of these ranges. Each heater zone with the respective heaters may be controlled independently, which may allow each heater zone to be operated (or deactivated) at its own temperature to address radial and/or azimuthal non-uniformity issues, although in some instances some or all of the heater zones may be heated to a same temperature.

By providing an upper heater and a lower heater within the substrate assembly as described herein, improved temperature control of the substrate support surface is possible. In particular, independent temperature of the various heater zones may be used to combat radial and/or azimuthal non-uniformity issues by enabling each heater zone to be used as a tuning knob to control the temperature (and subsequently a deposition rate) within a given region of a substrate positioned atop the substrate support surface. Additionally, by sufficiently spacing the heaters apart from the RF electrode, RF coupling loss and DC leakage current may be reduced and/or minimized.

Figure 5:
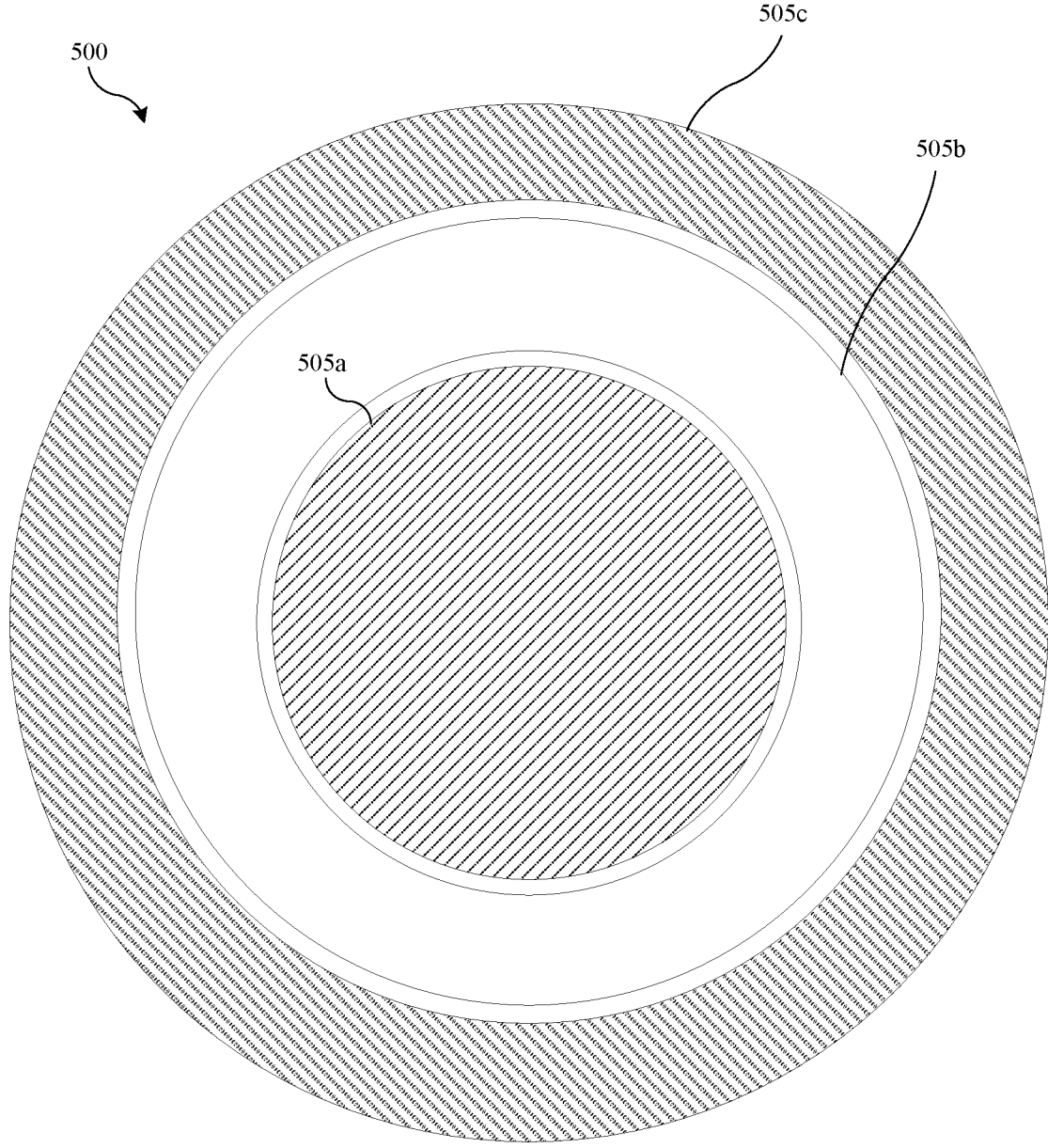
FIG. 5 shows a schematic top plan view of an exemplary upper heater according to some embodiments of the present technology.

FIG. 5 illustrates a schematic top plan view of an upper heater 500 according to embodiments of the present technology. Upper heater 500 may be any of the heaters previously described, such as included in substrate support assembly 400, or any other number of pedestals or chucks. The upper heater 500 may be embedded in a puck or chuck body as described above, such as a ceramic including aluminum nitride, and may be characterized by any of the features, configurations, or characteristics as discussed above for any substrate support. Upper heater 500 may be divided into a number of upper heater zones 505. For example, upper heater 500 may be divided into three upper heater zones 505. For example, a center circular heater zone 505a is encircled by an inner annular upper heater zone 505b and an outer annular upper heater zone 505c, with each of the upper heater zones 505 being concentric with one another. Such an arrangement of upper heater zones 505 may enable radial tuning of the temperature of a substrate support surface and substrate.

The size of each of the upper heater zones 505 may be adjusted to meet the needs of a particular application. In a particular embodiment, the center heater zone 505a may extend radially outward to at least or about 30% of a radial distance of the substrate support surface, at least or about 40% of a radial distance of the substrate support surface, at least or about 50% of a radial distance of the substrate support surface, at least or about 60% of a radial distance of the substrate support surface, or more. The inner diameter of the inner annular upper heater zone 505b may begin at least or about 30% of a radial distance of the substrate support surface, at least or about 40% of a radial distance of the substrate support surface, at least or about 50% of a radial distance of the substrate support surface, at least or about 60% of a radial distance of the substrate support surface, or more. The outer diameter of the inner annular heater zone 505b may extend radially outward to at least or about 60% of a radial distance of the substrate support surface, at least or about 65% of a radial distance of the substrate support surface, at least or about 70% of a radial distance of the substrate support surface, at least or about 75% of a radial distance of the substrate support surface, at least or about 80% of a radial distance of the substrate support surface, at least or about 85% of a radial distance of the substrate support surface, or more. An inner diameter of the outer annular upper heater zone 505c may begin at least or about 70% of a radial distance of the substrate support surface, at least or about 75% of a radial distance of the substrate support surface, at least or about 80% of a radial distance of the substrate support surface, at least or about 85% of a radial distance of the substrate support surface, at least or about 90% of a radial distance of the substrate support surface, or more. The outer diameter of the outer annular heater zone 505c may extend radially outward to at least or about 100% of a radial distance of the substrate support surface, at least or about 105% of a radial distance of the substrate support surface, at least or about 110% of a radial distance of the substrate support surface, at least or about 115% of a radial distance of the substrate support surface, at least or about 120% of a radial distance of the substrate support surface, at least or about 125% of a radial distance of the substrate support surface, or more. In some embodiments, some or all of the upper heater zones 505 may be in contact with one another, while in other embodiments, one or more of the upper heater zones 505 may be separated by small gaps. These gaps may be less than or about 15 mm wide, less than or about 10 mm wide, less than or about 5 mm wide, or less.

Figure 6:
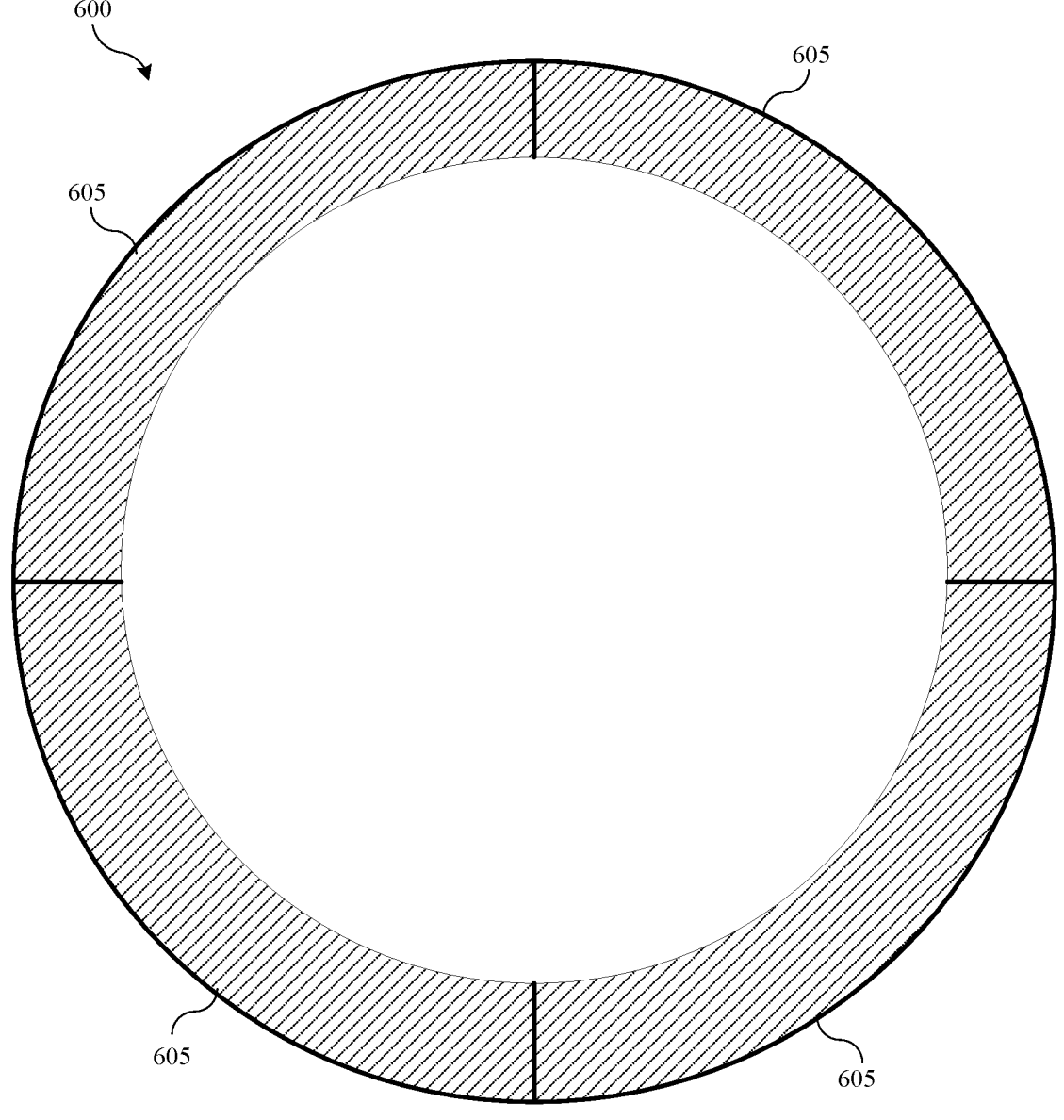
FIG. 6 shows a schematic top plan view of an exemplary lower heater according to some embodiments of the present technology.

FIG. 6 illustrates a schematic top plan view of a lower heater 600 according to embodiments of the present technology. Lower heater 600 may be any of the heaters previously described, such as included in substrate support assembly 400, or any other number of pedestals or chucks. The lower heater 600 may be embedded in a puck or chuck body as described above, such as a ceramic including aluminum nitride, and may be characterized by any of the features, configurations, or characteristics as discussed above for any substrate support. Lower hater 600 may be divided into a number of lower heater zones 605. For example, lower heater 600 may be divided into four lower heater zones 605. For example, each of the lower heater zones 605 may be arcuate in shape, with the lower heater zones 605 collectively forming an annular shape that defines an open interior. Such a configuration of a lower heater 600 may enable the temperature of edge regions of the substrate support surface to be heated independently of the medial portion of the substrate support surface, which may enable radial film thickness non-uniformity issues to be mitigated, especially proximate the peripheral edge regions. For example, one or more of the lower heater zones 605 may be powered to supply additional heat to one or more actuate regions of the substrate support surface that are proximate the edge regions of the substrate support surface. Additionally, the use of arc-shaped lower heater zones 605 may enable azimuthal tuning of the temperature of a substrate support surface and substrate.

The size of each of the lower heater zones 605 may be adjusted to meet the needs of a particular application. For example, an inner edge of each of the plurality of arcuate heater zones is disposed radially inward of the substrate seat. In a particular embodiment, the inner diameter of each lower heater zone 605 may begin at least or about 50% of a radial distance of the substrate support surface, at least or about 60% of a radial distance of the substrate support surface, at least or about 70% of a radial distance of the substrate support surface, at least or about 80% of a radial distance of the substrate support surface, or more. An outer edge of each of the lower heater zones may be disposed at a distance from a center of the substrate seat that is aligned with or radially outward of a peripheral edge of the substrate seat. For example, the outer diameter of each lower heater zone 605 may extend radially outward to at least or about 100% of a radial distance of the substrate support surface, at least or about 105% of a radial distance of the substrate support surface, at least or about 110% of a radial distance of the substrate support surface, at least or about 115% of a radial distance of the substrate support surface, at least or about 120% of a radial distance of the substrate support surface, at least or about 125% of a radial distance of the substrate support surface, or more.

While shown with four lower heater zones, it will be appreciated that more or fewer lower heater zones may be provide in various embodiments, with greater number of heater zones providing greater granularity to control the temperature in smaller, more confined radial and/or azimuthal regions of the substrate support surface. Additionally, the lower heater zones are not limited to arcuate shapes. In some embodiments, other shapes, such as wedge-shaped zones, may be utilized. One or more additional rows of lower heater zones may be provided to enable more radial control of the temperature of the substrate support surface. Some or all of the lower heater zones may extend entirely to a center of the substrate support surface and/or otherwise within an inner 50% of the radial distance of the center.

Figure 7:
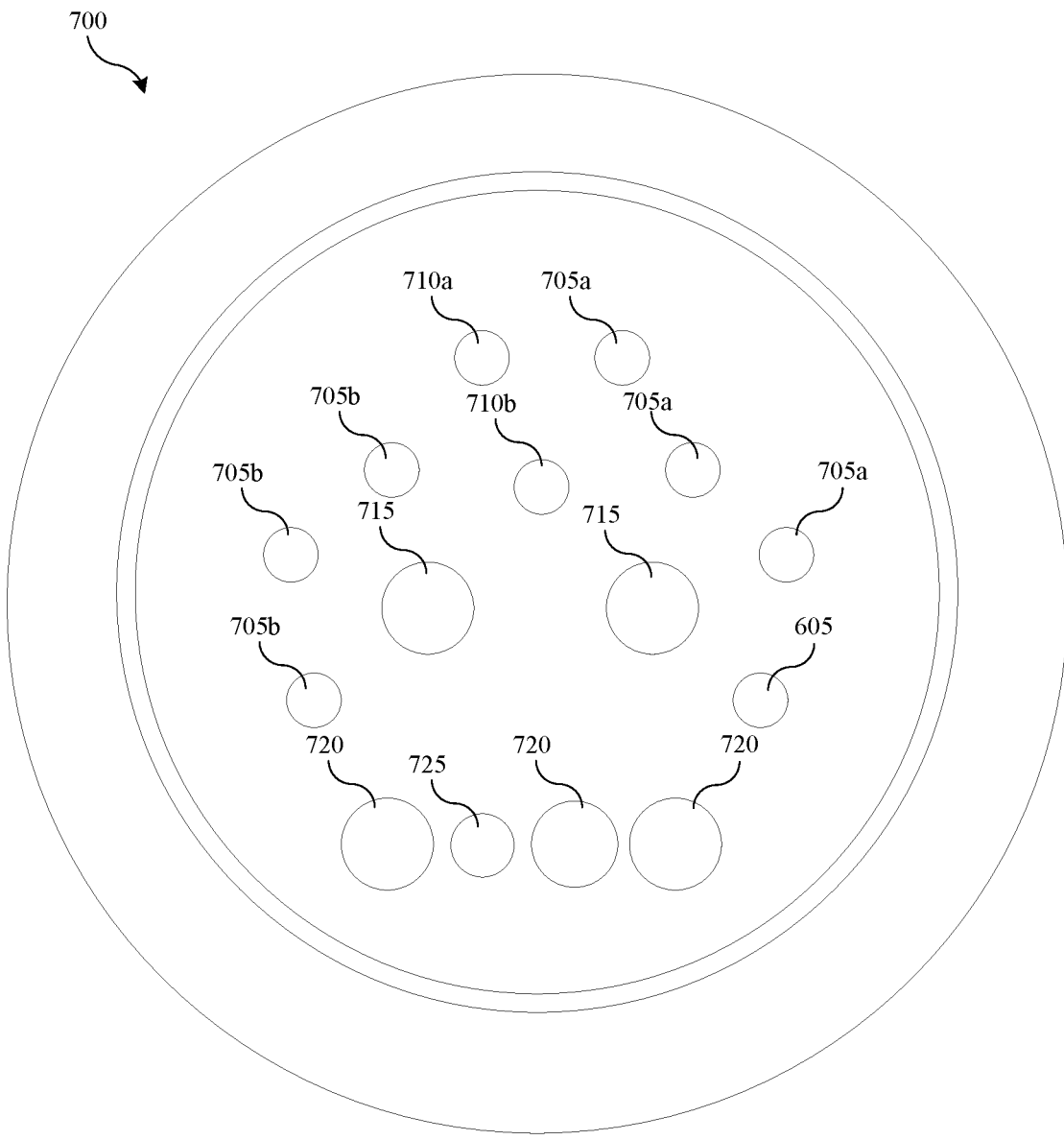
FIG. 7 shows a schematic partial cross-sectional top view of an exemplary substrate support stem according to some embodiments of the present technology.

FIG. 7 illustrates a schematic cross-sectional top view of a substrate support stem 700 according to embodiments of the present technology. Stem 700 may be used to support any of the heaters previously described, such as included in substrate support assembly 400, or any other number of pedestals or chucks. Stem 700 may include a number of heater wires or rods 705, which may deliver power from a power source to the various heater zones. For example, main heater rods 705a may each couple with and deliver power to one of a number of upper heater zones. As shown, three main heater rods 705a are provided that each supply power to one upper heater zone, such as for an upper heater of the configuration shown in FIG. 5. Secondary heater rods 705b may each couple with and deliver power to one of a number of lower heater zones. As shown, four secondary heater rods 705a are provided that each supply power to one lower heater zone, such as for a lower heater of the configuration shown in FIG. 6. Stem 700 may include one or more heater return rods 710, which may be used to as current return connections for one or more of the heaters. For example, the stem 700 may include a single main return rod 710a, which may be coupled to each of the upper heating zones. A single secondary return rode 710a may be coupled to each of the lower heating zones. Stem 700 may include one or more RF rods 715, which may each couple an RF mesh or other electrode of a substrate support with an RF power source for facilitating plasma formation and/or generating a chucking force at a substrate support surface of the substrate support. Additional connections may be included in some embodiments. For example, stem 700 may include one or more thermocouples 720, which may be used to monitor the temperature at one or more of the heater zones of the substrate support. Additionally, a purge channel 725 may be provided that may be used to supply a purge gas to a backside of a substrate.

In order to prevent AC/DC and/or RF current leakage, the various rods may satisfy minimum spacing requirements. For example, each of the heater/RF rods may be maintained at a distance of at least or about 8 mm apart (from centerline to centerline), at least or about 9 mm apart, at least or about 10 mm apart, at least or about 11 mm apart, at least or about 12 mm apart, at least or about 13 mm apart, at least or about 14 mm apart, at least or about 15 mm apart, or more. A distance between any part of each AC rod 705 and/or return rod 710 may be at least or about 2 mm, at least or about 3 mm, at least or about 4 mm, at least or about 5 mm, or more. A distance between any part of an RF rod 715 and a heater rod 705 and/or a return rod 710 may be at least or about 3 mm, at least or about 4 mm, at least or about 5 mm, at least or about 6 mm, or more.

It will be appreciated that the layout of rods within stem 700 is merely one example of a layout, and that numerous variations exist. The configuration of the stem 700 may be modified to meet the needs of a particular application. For example, for substrate supports with more or fewer heater zones, the layout may be adapted to include more or fewer heater rods and/or return rods. In some embodiments, rather than sharing return rods, each heater zone may have a dedicated return rod. To maintain minimum spacing between rods to prevent current leakage, a size of the stem may be expanded to accommodate greater numbers of heater zones.

Figure 8:
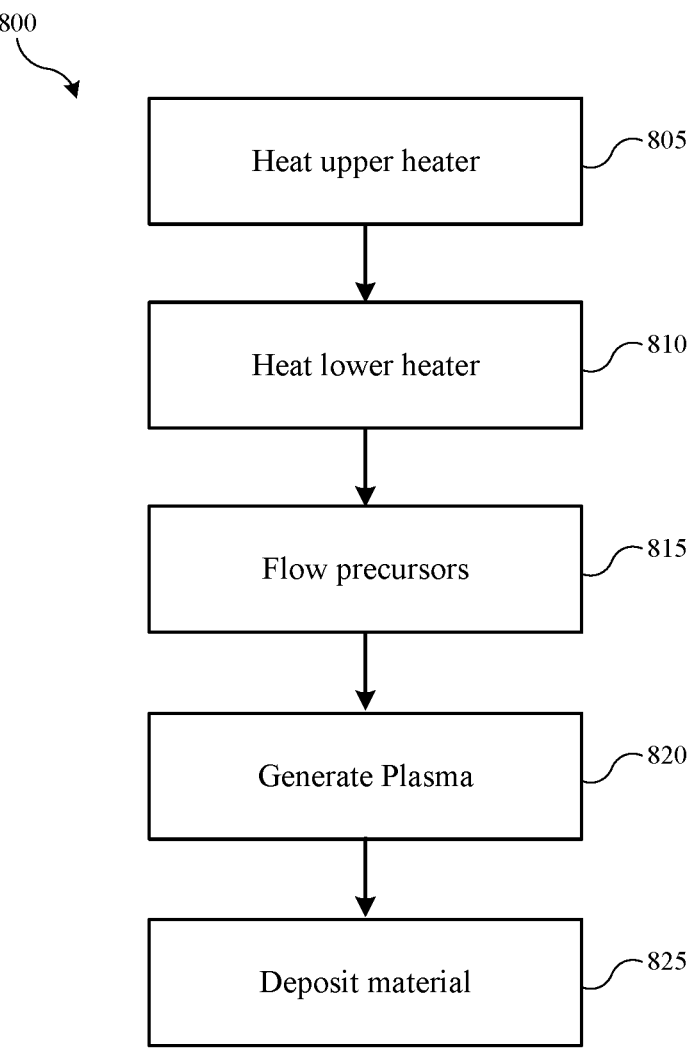
FIG. 8 shows exemplary operations in a processing method according to some embodiments of the present technology.

FIG. 8 shows operations of an exemplary method 800 of semiconductor processing according to some embodiments of the present technology. The method may be performed in a variety of processing chambers, including processing system 100 or chamber 300 described above, which may include substrate support assemblies according to embodiments of the present technology, such as substrate support assembly 130, 210, 310, and/or 400 described herein. Method 800 may include a number of optional operations, which may or may not be specifically associated with some embodiments of methods according to the present technology.

Method 800 may include a processing method that may include operations for forming a hardmask film or other deposition operations. The method may include optional operations prior to initiation of method 800, or the method may include additional operations. For example, method 800 may include operations performed in different orders than illustrated. In some embodiments, method 800 may include heating an upper heater embedded within a substrate support assembly to heat a top surface of a substrate support assembly at operation 805. For example, an AC or DC current may be supplied to one or more heating elements that form the upper heater to heat a top portion of an electrostatic chuck body. In some embodiments, the upper heater may include a number of heater zones, which may each be heated during operation 805. For example, the upper heater may include a circular center heater zone that is surrounded by one or more annular heater zones. At operation 810, the method 800 may include heating at least one lower heater zone of a plurality of lower heater zones embedded within the substrate support assembly below the upper heater. For example, an AC or DC current may be supplied to a heating element that makes up the lower heater zone(s) to be heated. The lower heater zones may be arcuate in shape in some embodiments, and may collectively form an annular shaped lower heater that may be used to supply additional heat to the peripheral edge regions of the substrate support surface. The various upper and/or lower heating zones may be heated to a same and/or a different temperature depending on the needs of a particular deposition process.

In some embodiments, the method 800 may include clamping a semiconductor substrate to a support surface of a substrate platform using a chucking voltage. One or more precursors may be flowed into a processing chamber at operation 815. For example, the precursor may be flowed into a chamber, such as included in chamber 300. At operation 820, a plasma may be generated of the precursors within the processing region, such as by providing RF power to the faceplate to generate a plasma. Material formed in the plasma may be deposited on the substrate at operation 825.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, or components.

What is claimed is:

1. A substrate support assembly, comprising:
an electrostatic chuck body defining a substrate support surface that defines a substrate seat;
a support stem coupled with the electrostatic chuck body;
an upper heater embedded within the electrostatic chuck body, the upper heater comprising a circular center heater zone and one or more annular heater zones that are concentric with the center heating zone; and
a lower heater embedded within the electrostatic chuck body at a position below the upper heater, the lower heater comprising a plurality of arcuate heater zones, wherein:
the plurality of arcuate heater zones define an annular shape with an open interior; and
an inner edge of the lower heater is positioned radially outward of at least about 50% of a radius of the substrate seat.

2. The substrate support assembly of claim 1, further comprising:
a plurality of heater power rods extending through the support stem, each of the plurality of heater power rods being electrically coupled with a respective heater zone.

3. The substrate support assembly of claim 2, wherein:
each of the plurality of heater power rods are spaced apart by at least 2 mm within the support stem.

4. The substrate support assembly of claim 2, further comprising:
an RF rod extending through the support stem and electrically coupled with the electrostatic chuck body.

5. The substrate support assembly of claim 4, wherein:
the RF rod is spaced apart from each rod of a plurality of AC rods by at least 3 mm within the support stem.

6. The substrate support assembly of claim 1, further comprising:
a first heater return rod that is coupled with the center heater zone and each of the one or more annular heater zones; and
a second heater return rod that is coupled with each of the plurality of arcuate heater zones.

7. The substrate support assembly of claim 1, wherein:
the lower heater is disposed at a distance of between about 2 mm and 10 mm from the upper heater.

8. The substrate support assembly of claim 1, wherein:
an inner edge of each of the plurality of arcuate heater zones is disposed radially inward of the substrate seat; and
an outer edge of each of the plurality of arcuate heater zones is disposed at a distance from a center of the substrate seat that is aligned with or radially outward of a peripheral edge of the substrate seat.

9. A substrate support assembly, comprising:
an electrostatic chuck body defining a substrate support surface that defines a substrate seat;
a support stem coupled with the electrostatic chuck body;
an upper heater embedded within the electrostatic chuck body; and
a lower heater embedded within the electrostatic chuck body at a position below the upper heater, the lower heater comprising a plurality of arcuate lower heater zones, wherein an inner edge of the lower heater is positioned radially outward of at least about 50% of a radius of the substrate seat.

10. The substrate support assembly of claim 9, wherein:
each of the plurality of lower heater zones comprises a heating coil.

11. The substrate support assembly of claim 9, wherein:
the plurality of lower heater zones comprises at least four
    lower heater zones.

12. The substrate support assembly of claim 9, wherein:
the upper heater comprising a plurality of upper heater
    zones.

13. The substrate support assembly of claim 12, wherein:
the plurality of upper heater zones comprise a circular
    heater zone and at least two annular circular heater
    zones that are positioned radially outward of the cir-
    cular heater zone.

14. The substrate support assembly of claim 9, further
comprising:
    an RF mesh embedded within the electrostatic chuck body
        above the upper heater.

15. The substrate support assembly of claim 9, wherein:
the plurality of lower heater zones collectively form an
    annular shape defining an open central region.

\*   \*   \*   \*   \*